United States Patent
Huang (10) Patent No.: US 8,921,916 B2
(45) Date of Patent: Dec. 30, 2014

(54) SINGLE POLY ELECTRICALLY ERASABLE PROGRAMMABLE READ ONLY MEMORY (SINGLE POLY EEPROM) DEVICE

(71) Applicant: Vanguard International Semiconductor Corporation, Hsinchu (TW)

(72) Inventor: Chih-Jen Huang, Yilan County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 162 days.

(21) Appl. No.: 13/672,860

(22) Filed: Nov. 9, 2012

(65) Prior Publication Data
US 2013/0234229 A1    Sep. 12, 2013

(30) Foreign Application Priority Data
Mar. 12, 2012    (TW) .............................. 101108245 A (51) Int. Cl.
| H01L 29/788 | (2006.01) |
| H01L 29/792 | (2006.01) |
| H01L 21/84 | (2006.01) |
| H01L 27/115 | (2006.01) |
| H01L 27/12 | (2006.01) |

(52) U.S. Cl.
CPC ............ *H01L 29/7883* (2013.01); *H01L 21/84* (2013.01); *H01L 29/7881* (2013.01); *H01L 27/11558* (2013.01); *H01L 27/1203* (2013.01)

USPC ................... 257/318; 257/321; 257/E29.304; 257/E29.309

(58) Field of Classification Search
USPC ................... 257/321, E29.304, 318, E29.309
See application file for complete search history.

(56) References Cited

U.S. PATENT DOCUMENTS

| 5,929,478 | A | * | 7/1999 | Parris et al. ................... 257/314 |
| 2008/0217699 | A1 | * | 9/2008 | Disney et al. ................. 257/378 |
| 2008/0217729 | A1 | * | 9/2008 | Disney et al. ................. 257/513 |
| 2008/0224172 | A1 | * | 9/2008 | Gauthier et al. ............. 257/141 |
| 2010/0041185 | A1 | * | 2/2010 | Hofmann et al. ............. 438/142 |
| 2010/0302854 | A1 | * | 12/2010 | Wu et al. .................. 365/185.18 |
| 2011/0031555 | A1 | * | 2/2011 | Shih et al. ...................... 257/369 |
| 2011/0062540 | A1 | * | 3/2011 | Saito et al. .................... 257/432 |
| 2011/0102620 | A1 | * | 5/2011 | Sakano et al. ............. 348/222.1 |
| 2011/0133287 | A1 | * | 6/2011 | Jain ............................... 257/368 |
| 2013/0256800 | A1 | * | 10/2013 | Qiao et al. .................... 257/350 |

* cited by examiner

*Primary Examiner* — Victor A Mandala
(74) *Attorney, Agent, or Firm* — Birch, Stewart, Kolasch & Birch, LLP (57) ABSTRACT

A single poly electrically erasable programmable read only memory (single poly EEPROM) device is provided, including: a semiconductor on insulator (SOI) substrate having a P-type semiconductor layer over an insulator layer; a P-well region formed in a portion of the P-type semiconductor layer; a trench isolation formed in the P-type semiconductor layer, surrounding the P-well region; an NMOS transistor formed over a portion of the P-type semiconductor layer of the P-well region; a P+ doping region formed over another portion of the P-type semiconductor layer of the P-well region; and a control gate formed in another portion of the P-type semiconductor layer, adjacent to the trench isolation.

16 Claims, 6 Drawing Sheets

SINGLE POLY ELECTRICALLY ERASABLE PROGRAMMABLE READ ONLY MEMORY (SINGLE POLY EEPROM) DEVICE

CROSS REFERENCE TO RELATED APPLICATIONS

This Application claims priority of Taiwan Patent Application No. 101108245, filed on Mar. 12, 2012, the entirety of which is incorporated by reference herein.

BACKGROUND OF THE INVENTION

1. Field of the Invention

The present invention relates to a semiconductor memory device, and in particularly to a single poly electrically erasable programmable read only memory (single poly EEPROM) device having advantages such as reduced size, low power consumption, and simplified periphery circuits.

2. Description of the Related Art

Electrically erasable programmable read only memory (EEPROM) and flash electrically erasable programmable read only memory (flash EEPROM) are non-volatile memories, having advantages of data memory after being power-off, having a repeatable data reading function, and fast data transferring, and can thus be applied to various applications.

In many modern information, communication, and consumer electrical products, non-volatile memories are essential elements. With increased demand of small sized portable electrical products such as personal digital assistants (PDA) or mobile phones, demand for memory chips comprising EEPROM have thus increased. Therefore, development of EEPROMs with lower power consumption, faster writing efficiencies, more reduced size of memory cells, and higher memory cell densities are being required to meet the future demand of the electrical products.

BRIEF SUMMARY OF THE INVENTION

An exemplary single poly electrically erasable programmable read only memory (single poly EEPROM) device is provided, comprising: a semiconductor on insulator (SOI) substrate having a P-type semiconductor layer over an insulator layer; a P-well region formed in a portion of the P-type semiconductor layer; a trench isolation formed in the P-type semiconductor layer, surrounding the P-well region; an NMOS transistor formed over a portion of the P-type semiconductor layer of the P-well region; a P+ doping region formed over another portion of the P-type semiconductor layer of the P-well region; and a control gate formed in another portion of the P-type semiconductor layer, adjacent to the trench isolation.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
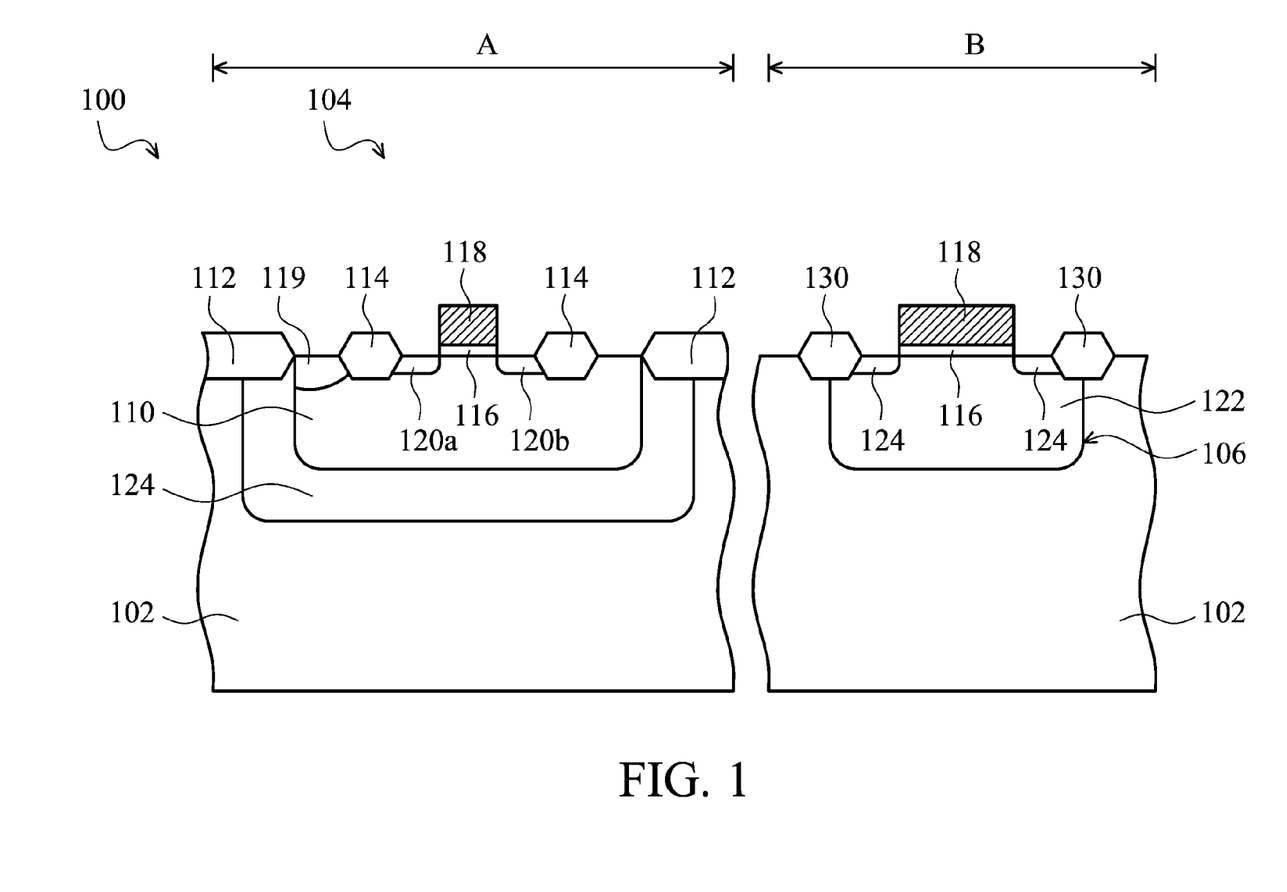
FIG. 1 shows a cross section of a memory cell unit in a Single poly electrically erasable programmable read only memory (single poly EEPROM) device according to an embodiment of the invention.
Figure 2:
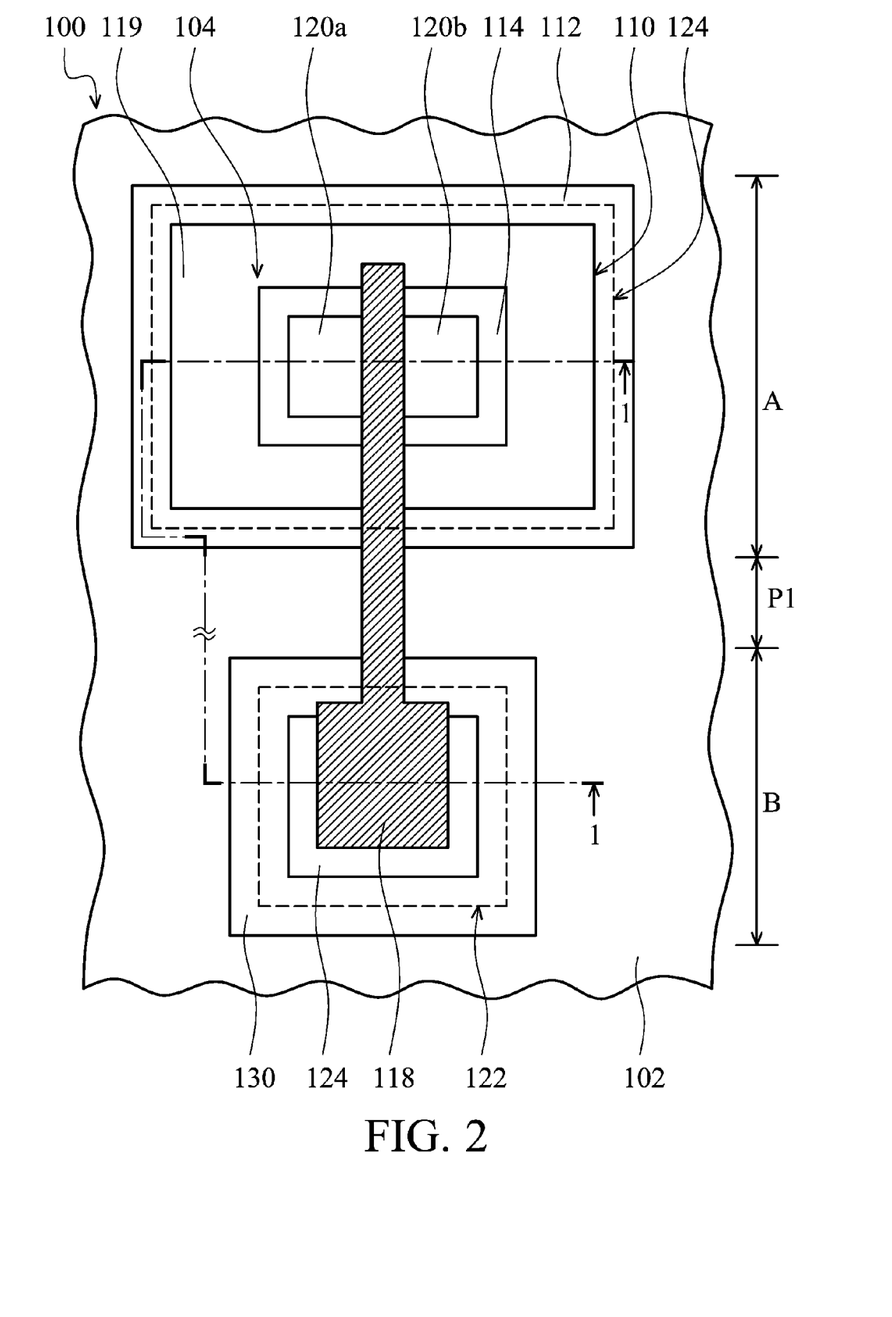
FIG. 2 shows a top view of the memory cell unit shown in FIG. 1.

FIGS. 1-2 are schematic diagrams showing a memory cell unit 100 in an exemplary single poly electrically erasable programmable read only memory (single poly EEPROM) device.

Herein, FIG. 2 shows a top view of the memory cell unit 100, and FIG. 1 shows a cross section taken along line 1-1 in FIG. 2, partially illustrating the memory cell unit 100. The memory cell unit 100 is a memory cell unit in a single poly EEPROM known by the inventor of the present application, and the memory cell unit 100 is used as a comparative embodiment for describing problems found by the inventor, but is not to limit the scope of the present application.

In FIGS. 1 and 2, the memory cell unit 100 mainly comprises an NMOS transistor disposed in a region A of a semiconductor substrate 102 and a control gate 106 disposed in a region B of the semiconductor substrate 102. As shown in FIG. 2, the NMOS transistor 104 is disposed in a portion of the semiconductor substrate 102 in the region A, and the control gate 106 is disposed in a portion of the semiconductor substrate 102 in the region B.

In the memory cell unit 100, the semiconductor substrate 102 is a bulk substrate, such as a P-type doped bulk silicon substrate, and the NMOS transistor 104 is disposed over a P-well region 110 disposed in the semiconductor substrate 102. The P-well region 110 is defined by a field oxide 112, and the field oxide 112 encircles around a portion of the top surface of the semiconductor substrate 102, thereby defining the P-well region 110 in the semiconductor substrate 102. In addition, another field oxide 114 is formed over the semiconductor substrate 102 in the P-well region 110, and the field oxide 114 encircles around a portion of the top surface of the semiconductor substrate 112 in the P-well region 110, thereby defining a region for disposing the NMOS transistor 104. A P+ doping region 119 is formed between the field oxide 114 and the field oxide 112. In this embodiment, a P-type dopant concentration in the P-well region 110 is greater than that in the semiconductor substrate 102, and a P-type dopant concentration in the P+ doping region 119 is greater than that in the P-well region 110. The P-well region 110 and the P+ doping region 119 are formed by doping P-type dopants such as boron in the semiconductor substrate 102.

Herein, the NMOS transistor 104 disposed over the P-well region 110 comprises a gate dielectric layer 116 and a polysilicon layer 118 disposed over a portion of the P-well region 110, and a pair of N+ doping regions 120a and 120b disposed in the P-well region 110 and on opposite sides of the polysilicon layer 118 and the gate dielectric layer 116, respectively function as a source region and a drain region. The P-well region 110 underlying the gate dielectric layer 116 and between the N+ doping regions 120a and 120b functions as a channel of the NMOS transistor 104. During an operation of the memory cell unit 100, the NMOS transistor 104 may function as a memory cell, and the polysilicon layer 118 may function as a floating gate, and the gate dielectric layer 116 functions as a tunneling oxide layer. During operations of the memory cell unit 100, hot electron injections and hot hole injections are used to inject electrons into the polysilicon layer 118 of the NMOS transistor 104 and remove electrons form the polysilicon layer 118 of the NMOS transistor 104, thereby respectively performing a program operation and an erase operation.

Moreover, an N-well region 122 is formed in the semiconductor substrate 102 in the region B to function as a control gate 106 of the memory cell unit 100, and the N-well region 112 is defined by a field oxide 130 formed in the region B. The field oxide 130 encircles a portion of the top surface of the semiconductor substrate 102 in the region B, thereby defining the N-well region 122.

As shown in FIG. 2, the gate dielectric layer 116 and the polysilicon layer 118 of the NMOS transistor 104 in the region A may further extend over the semiconductor substrate 102 in the region B, thereby partially covering the N-well region 122, and an N+ doping region 124 is further formed in the N-well region 122 not covered by the gate dielectric layer 116 and polysilicon layer 118 in the region B.

In addition, for preventing undesired bias punch-through effects caused between the P-well region 110 in the region A and the N-well region 122 in the region B during bias situations in operations such as program, erase or reading of the memory cell unit 100, a deep N-well region 124 is also formed in the semiconductor substrate 102 in the region A. The deep N-well region 124 is substantially disposed under a region defined by the field oxide 112 and encircles the P-well region 110 from a bottom and sidewalls thereof. Moreover, a pitch P1 remains between the region A and the region B to further prevent the above undesired bias punch-through effects. Therefore, due to the above restrictions such as the pitch P1 between the region A and the region B, and formation of the deep N-well region 124, the memory cell unit 100 thus occupies too much top surface of the semiconductor substrate 102, and this is disadvantageous for size reduction of the memory cell unit 100.

Figure 3:
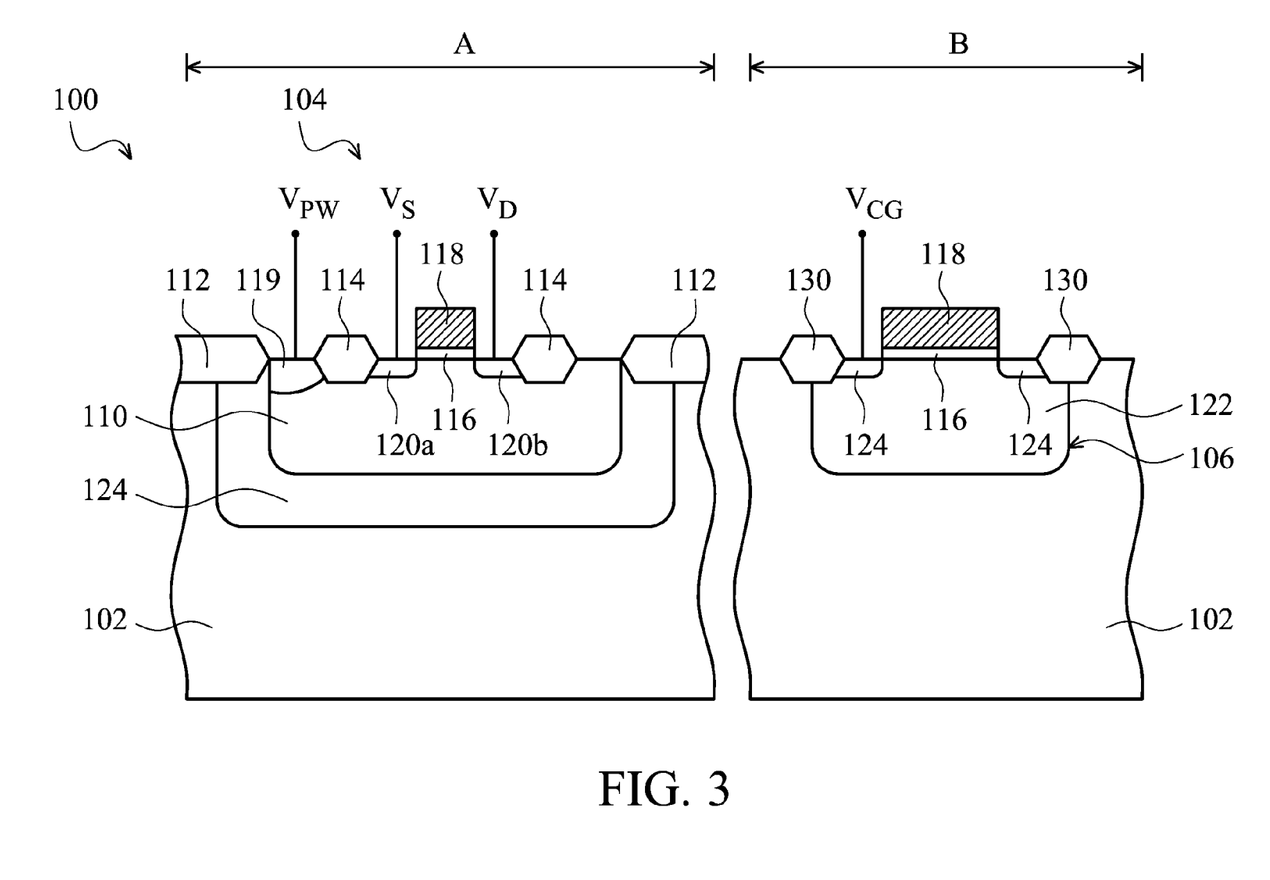
FIG. 3 is a schematic diagram showing various operations of the memory cell unit shown in FIGS. 1-2.

Referring to FIG. 3 and the following table 1, various operations of the memory cell unit 100 shown in FIGS. 1-2 are illustrated. During various operations such as program, erase and read of the memory cell unit 100, predetermined bias may be provided between the P+ doping region 119, the N+ doping regions 120a and 120b (respectively functioning as a source region and a drain region), and N+ doping region 124 through sequentially formed contacts (not shown) and interconnecting circuits (not shown). During these operations, a voltage applied to the N+ doping region 124 is entitled as $V_{CG}$, a voltage applied to the source region (i.e. the N+ doping region 120a) in the region A is entitled as $V_S$, a voltage applied to the source region (i.e. the N+ doping region 120b) is entitled as $V_D$, and a voltage applied to the P+ doping region 119 in the region A is entitled as $V_{PW}$. The following Table 1 describes possible voltages during various operations, wherein "Floating" represents no voltage is applied thereto, and "GND" represents the node is coupled to a ground potential, and "$V_{CC}$" represent the node is coupled to a supplied voltage by the circuit which is adjustable according to various designs.

TABLE 1

| Operation | $V_{PW}$ | $V_S$ | $V_D$ | $V_{CG}$ |
|---|---|---|---|---|
| Program | GND | GND | 6~6.5 V | 7~9 V |
| Erase | 7 V | GND | Floating | −7 V |
| Read | GND | GND | 0.8~1.5 V | Vcc |

According to the operation voltages shown in Table 1, during an erase operation of the memory cell unit 100, due to the above described structural limitations of the memory cell unit 100, a voltage applied to the P+ doping region 119 (i.e. the $V_{PW}$) is some how limited and cannot be greater than 14V, such that a voltage of about 7 volts is applied to the P+ doping region 119 ($V_{PW}$) and a voltage of about −7 volts is applied to the N+ doping region 124 ($V_{CG}$). Since voltages of different polarities are applied to the above two various node, the above two regions will be coupled to two individual charge pump circuits of different polarities, such as a positive voltage and a negative voltage. Since two charge pump circuits of different polarities are needed for operating the memory cell unit 100, complicated periphery circuits are needed for the memory cell unit 100.

Moreover, since operations such as program and erase of the memory cell unit 100 are achieved by effects such as hot electron injection and hot hole injection, higher currents are needed, and operations of the memory cell unit 100 consume more power, which is undesired for improving operation efficiency of the memory cell unit 100.

Figure 4:
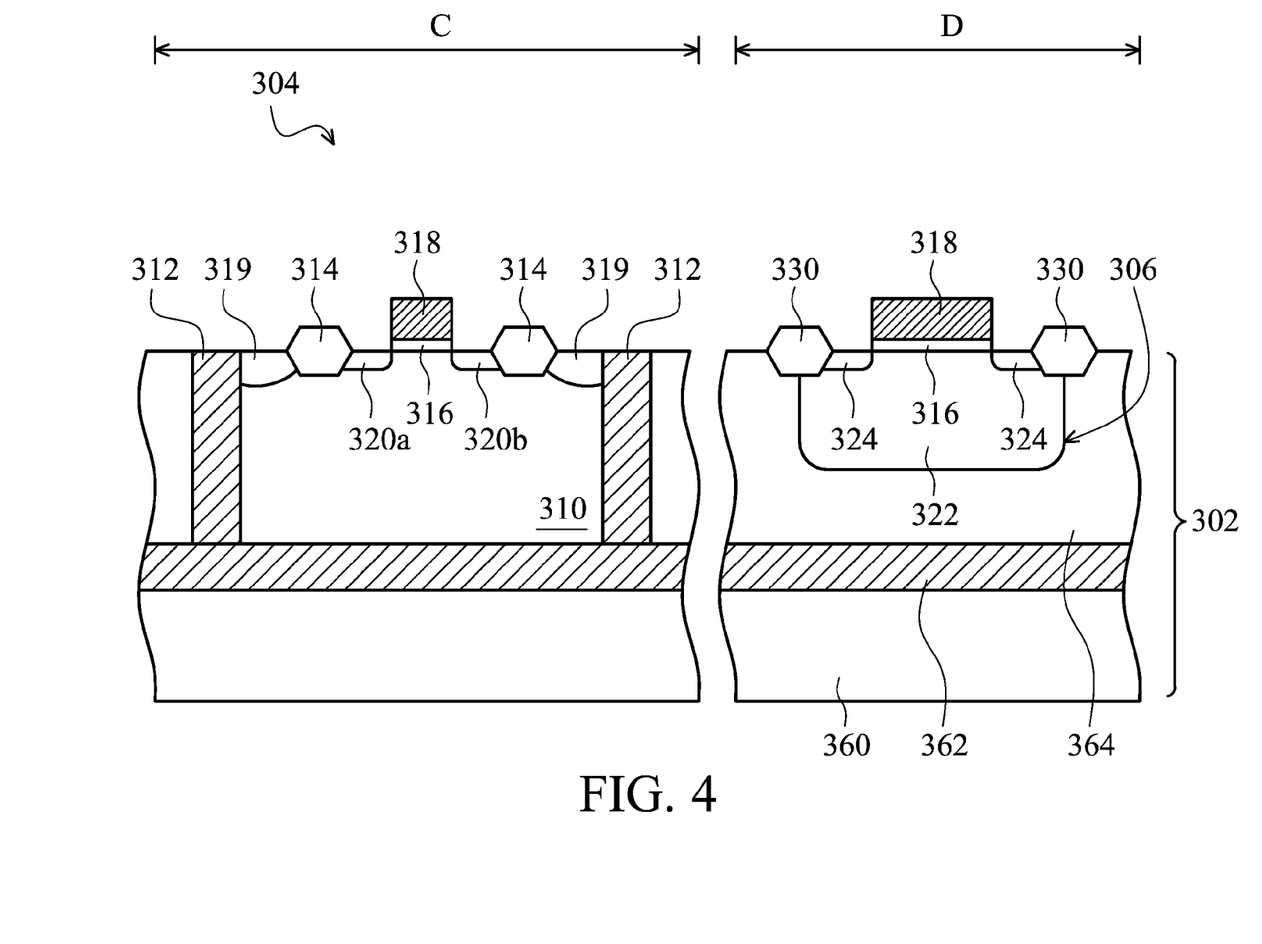
FIG. 4 shows a cross section of a memory cell unit in a Single poly electrically erasable programmable read only memory (single poly EEPROM) device according to another embodiment of the invention.
Figure 5:
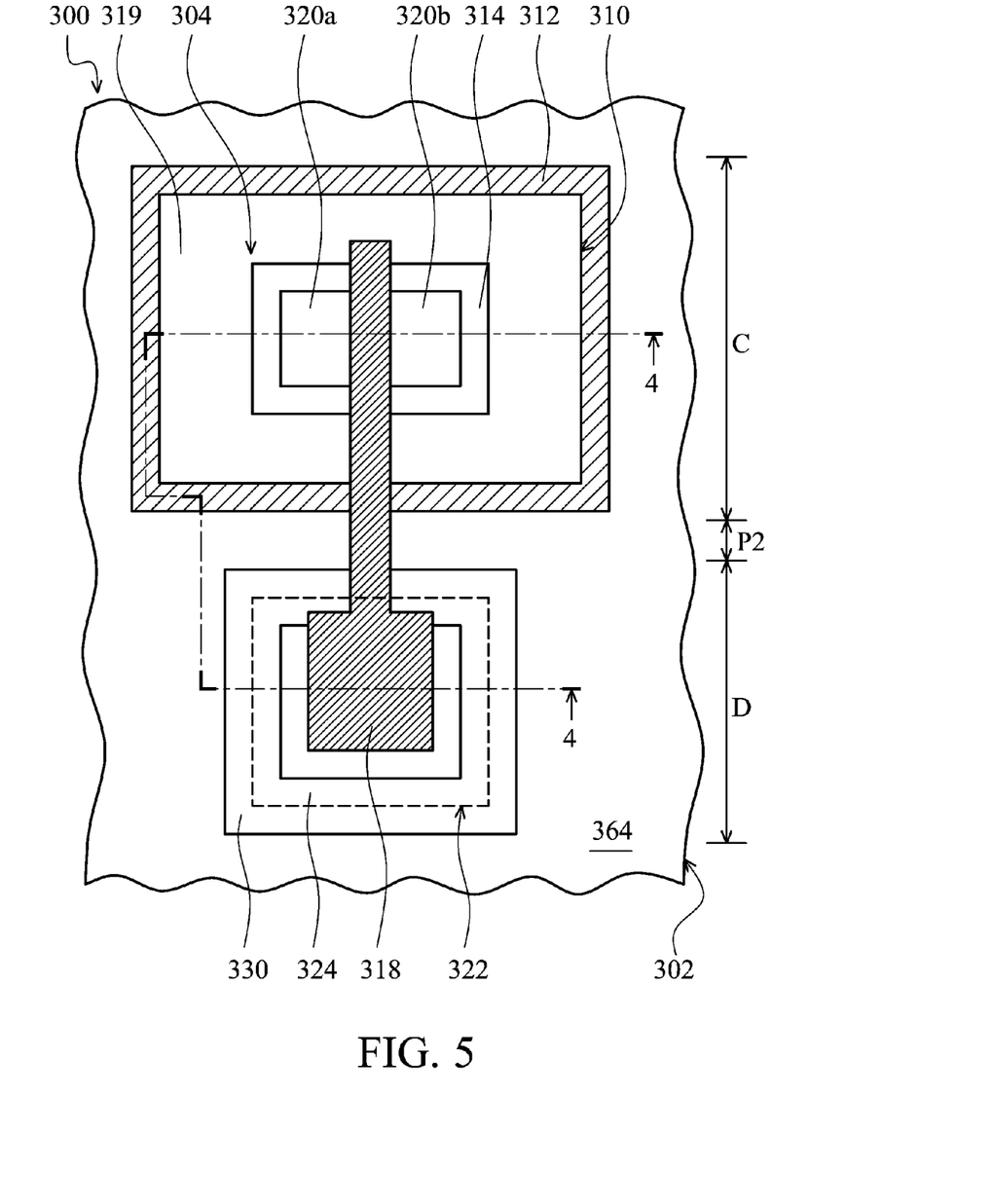
FIG. 5 shows a top view of the memory cell unit shown in FIG. 4.

Accordingly, FIGS. 4-5 are schematic diagrams showing a memory cell unit 300 in another exemplary single poly electrically erasable programmable read only memory (single poly EEPROM) device. When compared with the memory cell unit 100 shown in FIGS. 1-3, the memory cell unit 300 has various advantages such as a more reduced size, simplified periphery circuits, lower power consumption, and higher operation efficiency.

Herein, FIG. 5 shows a top view of the memory cell unit 300, and FIG. 4 shows a cross section taken along line 4-4 in FIG. 5, illustrating a portion of the memory cell unit 300.

Referring to FIGS. 4 and FIG. 5, the memory cell unit 300 mainly comprises an NMOS transistor 304 formed in a semiconductor substrate 302 in a region C, and a control gate 306 formed in the semiconductor substrate 302 in a region D. As shown in FIG. 5, the NMOS transistor 304 is disposed over a portion of the semiconductor substrate 302 in the region C, and the control gate 306 is disposed in a portion of the semiconductor substrate 302 in the region D. A pitch P2 (shown in FIG. 4) is formed between the regions C and D.

In this embodiment, the semiconductor substrate 302 is a semiconductor on insulator (SOI) substrate, comprising a semiconductor layer 360, an insulating layer 362 formed over the semiconductor layer 360, and another semiconductor layer 364 over the insulating layer 362. Herein, the insulating layer 362 can be, for example, an oxide layer, and the semiconductor layer 364 can be a P-type semiconductor layer, such as a P-type dopants doped epitaxial silicon layer. The NMOS transistor 304 is disposed over a portion of a P-well region 310 formed in the semiconductor layer 364, and the P-well region 310 is defined by a trench isolation 312. The trench isolation 312 encircles a portion of the top surface of the semiconductor layer 364 and penetrates through the semiconductor layer 364 from a top surface to a bottom surface thereof. Formation of the trench isolation 312 can be achieved by first etching the semiconductor layer 364 of the semiconductor substrate 302 to form a trench (not shown) partially exposing the insulating layer 362, and then filling insulating materials in the trench. Therefore, a bottom surface of the trench isolation 312 physically contacts the insulating layer 362 in the semiconductor substrate 302, thereby defining a P-well region 310 in the semiconductor layer 364.

A field oxide 314 is further formed over the semiconductor layer 364 in the P-well region 310, and the field oxide 314 encircles a portion of the top surface of the semiconductor layer 364 in the P-well region 310, thereby defining a region in the P-well region 310 for disposing the NMOS transistor 304. A P+ doping region 319 is formed between the field oxide 314 and the field oxide 312. In this embodiment, a P-type dopant concentration in the P-well region 310 is greater than that in the semiconductor layer 364, and a P-type dopant concentration in the P+ doping region 319 is greater than that in the P-well region 310. The P-well region 310 and the P+ doping region 319 are formed by doping P-type dopants such as boron in the semiconductor layer 364.

Herein, the NMOS transistor 304 disposed over the P-well region 310 comprises a gate dielectric layer 36 and a polysilicon layer 318 disposed over a portion of the P-well region 310, and a pair of N+ doping regions 320a and 320b disposed in the P-well region 310 adjacent to the polysilicon layer 318 and the gate dielectric layer 316 on opposite sides thereof, respectively functioning as a source region and a drain region of the NMOS transistor 304. The P-well region 310 underlying the gate dielectric layer 316 and between the N+ doping regions 320a and 320b functions as a channel of the NMOS transistor 304. During operation of the memory cell unit 300, the NMOS transistor 304 functions as a memory cell and the polysilicon layer 318 functions as a floating gate, and the gate dielectric layer 316 functions as a tunneling oxide layer. During program operation of the memory cell unit 300, effects such as hot electron injections and Fowler-Nordheim tunneling can be used. During erase operation of the memory cell unit 300, effects such as Fowler-Nordheim tunneling is mainly used.

In addition, an N-well region 322 is formed in the semiconductor layer 364 in the region D to function as a control gate 306 of the memory cell unit 300, and the N-well region 322 is defined by a field oxide 330 formed in the region C. The field oxide 330 encircles a portion of the top surface the semiconductor layer 364 in the region D, thereby defining the N-well region 322.

As shown in FIG. 5, the gate dielectric layer 316 and the polysilicon layer 318 of the NMOS transistor 304 formed in the region C further extends over the semiconductor substrate 302 in the region D to partially cover the N-well region 322, and an N+ doping region 324 is further formed in the N-well region 322 at a place not covered by the gate dielectric layer 316 and polysilicon layer 318 in the region D.

In addition, due to formation of the isolation trench 312, a pitch P2 between the region C and the region D can be reduced when compared with the pitch P1 between the regions A and B shown in FIG. 2. Thus, the memory cell unit 300 occupies less surface area of the semiconductor substrate 302 than the memory cell unit 100, thereby allowing further size reduction of the memory cell unit 300.

Figure 6:
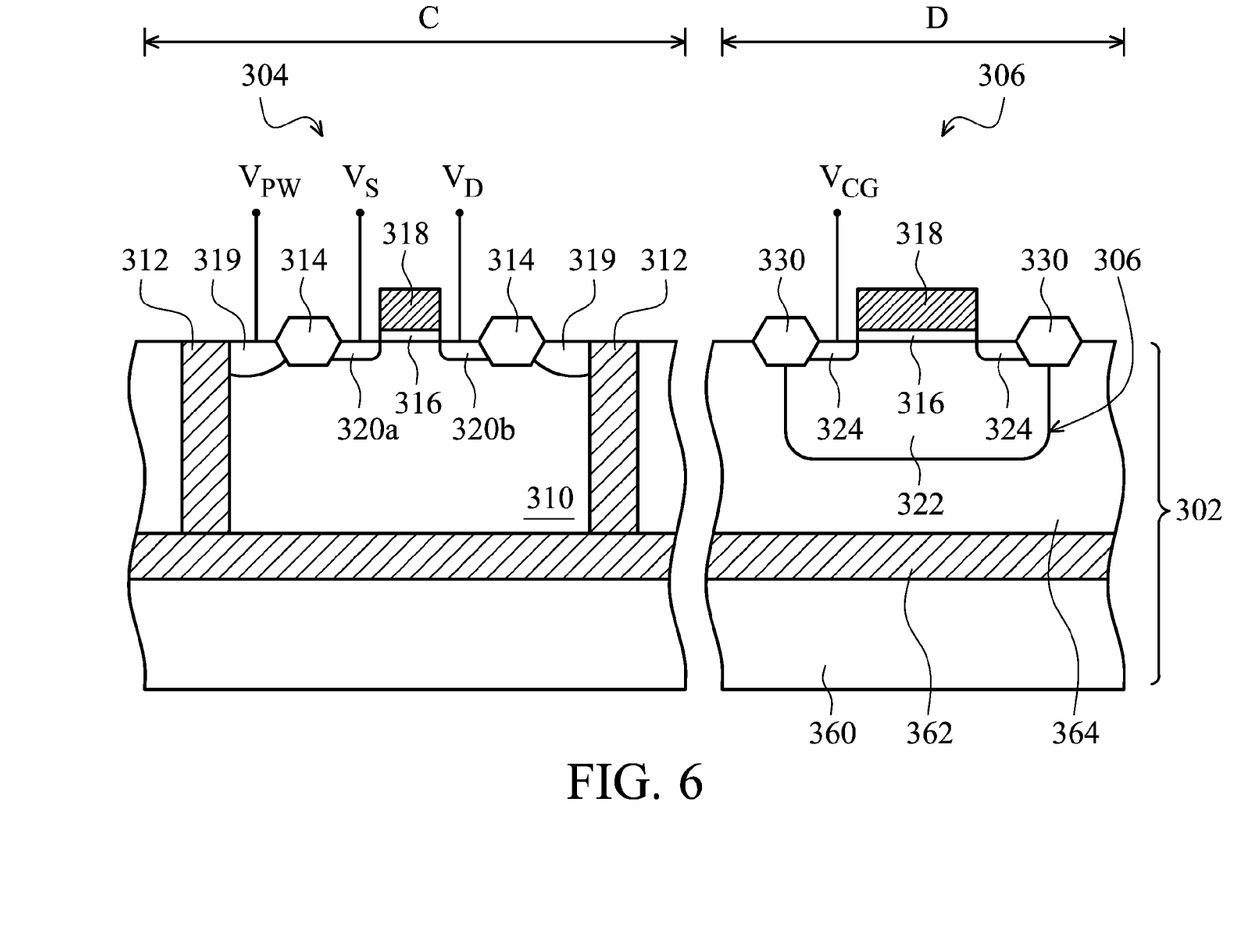
FIG. 6 is a schematic diagram showing various operations of the memory cell unit shown in FIGS. 4-5.

Referring to FIG. 6 and the following Table 2, various operations of the memory cell unit 300 shown in FIGS. 4-5 are illustrated. During various operations such as program, erase and read of the memory cell unit 300, predetermined bias may be provided between the P+ doping region 319, the N+ doping regions 320a and 320b (respectively functioning as a source region and a drain region), and N+ doping region 324 through sequentially formed contacts (not shown) and interconnecting circuits (not shown). During these operations, a voltage applied to the N+ doping region 324 is entitled as $V_{CG}$, a voltage applied to the source region (i.e. the N+ doping region 320a) in the region C is entitled as $V_S$, a voltage applied to the source region (i.e. the N+ doping region 320b) is entitled as $V_D$, and a voltage applied to the P+ doping region 319 in the region C is entitled as $V_{PW}$. The following Table 2 describes possible voltages during various operations, wherein "Floating" represents no voltage is applied thereto, and "GND" represents the node is coupled to a ground potential, and "$V_{CC}$" represent the node is coupled to a supplied voltage by the circuit which is adjustable according to various designs.

TABLE 2

| Operation | $V_{PW}$ | $V_S$ | $V_D$ | $V_{CG}$ |
|---|---|---|---|---|
| Program(1) | GND | GND | 6~7 V | 6~7 V |
| Program(2) | GND | GND | Floating | 12~14 V |
| Erase | 12~14 V | 12~14 V | Floating | GND |
| Read | GND | GND | 0.8~1.5 V | Vcc |

As shown in table 2, two possible program operations may be used for programming the memory cell unit 300, wherein the program operation (1) uses hot electron injections to program the memory cell unit 300, and the program operation (2) uses Fowler-Nordheim tunneling for programming the memory cell unit 300. Herein, due to formation of the trench isolation 312 in the region C, Fowler-Nordheim tunneling can be used for erasing the memory cell unit 300, and a voltage applied to the P+ doping region 314 can be operated at a voltage greater than 12-14 V without being affected by the above mentioned bias punch through effect.

In addition, voltages applied to various nodes are now with the same polarity, such that these nodes can be coupled to a charge pump circuit having the same polarity. Since the memory cell unit 300 only needs the charge pump circuit with one polarity, periphery circuits of the memory cell unit 300 can be thus simplified.

Further, due to operations such as program and erase of the memory cell unit 300 may being optionally achieved by Fowler-Nordheim tunneling effects, lower operation currents can be used when compared with operations performed by hot electron and hot hole injections, and the memory cell unit 300 consumes less energy and operation efficiency of the memory cell unit 300 is thus increased.

Accordingly, in one embodiment, a single poly electrically erasable programmable read only memory (single poly EEPROM) device is provided, having advantages such as reduced size, low power consumption, and simplified periphery circuits, and comprising: a semiconductor on insulator (SOI) substrate (e.g. the semiconductor substrate 302 shown in FIG. 4) having a P-type semiconductor layer (e.g. the semiconductor layer 364 shown in FIG. 4) over an insulator layer (e.g. the insulating layer 362 shown in FIG. 4); a P-well region (e.g. the P-well region 310 shown in FIG. 4) formed in a portion of the P-type semiconductor layer; a trench isolation (e.g. the trench isolation 312 shown in FIG. 4) formed in the P-type semiconductor layer, surrounding the P-well region; an NMOS transistor (e.g. the NMOS transistor 304 shown in FIG. 4) formed over a portion of the P-type semiconductor layer of the P-well region; a P+ doping region (e.g. the P+ doping region 319 shown in FIG. 4) formed over another portion of the P-type semiconductor layer of the P-well region; and a control gate (e.g. the N-well region 322 shown in FIG. 4) formed in another portion of the P-type semiconductor layer, adjacent to the trench isolation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A single poly electrically erasable programmable read only memory (single poly EEPROM) device, comprising:
    a semiconductor on insulator (SOI) substrate having a P-type semiconductor layer over an insulator layer;
    a P-well region formed in a portion of the P-type semiconductor layer;
    a trench isolation formed in the P-type semiconductor layer, surrounding the P-well region;
    an NMOS transistor formed over a portion of the P-type semiconductor layer of the P-well region;
    a P+ doping region formed over another portion of the P-type semiconductor layer of the P-well region; and
    a control gate formed in another portion of the P-type semiconductor layer, adjacent to the trench isolation, wherein the control gate does not physically contact the trench isolation.

2. The single poly EEPROM device as claimed in claim 1, wherein the SOI substrate further comprises a semiconductor layer, and the insulating layer and the P-type semiconductor are sequentially formed over the semiconductor layer.

3. The single poly EEPROM device as claimed in claim 1, wherein the trench isolation encircles the P-type well region, and a bottom surface of the trench isolation physically contacts the insulating layer.

4. The single poly EEPROM device as claimed in claim 1, further comprising a field oxide disposed over a portion of the P-type semiconductor layer in the P-type well region to encircle the NMOS transistor and to isolate the P+ doping region from the NMOS transistor.

5. The single poly EEPROM device as claimed in claim 4, wherein the P+ doping region encircles the field oxide.

6. The single poly EEPROM device as claimed in claim 4, wherein the NMOS transistor comprises:
    a gate dielectric layer disposed over a portion of the P-type semiconductor layer in the P well region;
    a polysilicon layer disposed over the gate dielectric layer; and
    an N+ doping region disposed in the P-type semiconductor layer on opposite two sides of the polysilicon layer.

7. The single poly EEPROM device as claimed in claim 4, wherein the gate dielectric layer and the polysilicon layer of the NMOS transistor further extend over a portion of the control gate.

8. The single poly EEPROM device as claimed in claim 1, wherein the control gate is an N-well region formed in another portion of the P-type semiconductor layer.

9. The single poly EEPROM device as claimed in claim 8, further comprising an N+ doping region formed in the N-well region.

10. The single poly EEPROM device as claimed in claim 9, further comprising a field oxide disposed over another portion of the P-type semiconductor layer in the P well region, surrounding the N+ doping region and the N-well region.

11. The single poly EEPROM device as claimed in claim 1, wherein a first positive voltage is applied to the control gate, a second positive voltage is applied to a drain region of the NMOS transistor, and a source region of the NMOS transistor and the P-well region are grounded to thereby program the single poly EEPROM device.

12. The single poly EEPROM device as claimed in claim 11, wherein the first positive voltage is of about 6-7 V, and the second positive voltage is of about 6-7 V, and the program operation is achieved by hot electron injection effects.

13. The single poly EEPROM device as claimed in claim 1, wherein a positive voltage is applied to the control gate, a drain region of the NMOS transistor is floated, and a source region of the NMOS transistor and the P-well region are grounded to thereby program the single poly EEPROM device.

14. The single poly EEPROM device as claimed in claim 13 wherein the positive voltage is of about 12-14 V and the program operation is achieved by Fowler-Nordheim tunneling effects.

15. The single poly EEPROM device as claimed in claim 1, wherein a first positive voltage is applied to the P well region, a second positive voltage is applied to a source region of the NMOS transistor, a drain region of the NMOS transistor is floated, and the control gate is grounded to thereby erase the single poly EEPROM device.

16. The single poly EEPROM device as claimed in claim 15, wherein the first positive voltage is about 12-14 V, and the second positive voltage is about 12-14 V, and the erase operation is achieved by Fowler-Nordheim tunneling effects.

* * * * *